United States Patent
Gruening

(10) Patent No.: US 6,359,299 B1
(45) Date of Patent: Mar. 19, 2002

(54) APPARATUS AND METHOD FOR FORMING CONTROLLED DEEP TRENCH TOP ISOLATION LAYERS

(75) Inventor: Ulrike Gruening, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/503,992

(22) Filed: Feb. 14, 2000

Related U.S. Application Data

(62) Division of application No. 09/127,262, filed on Jul. 31, 1998.

(51) Int. Cl.$^7$ .............................................. H01L 27/108
(52) U.S. Cl. ...................... 257/301; 257/311; 257/296; 257/510; 438/387; 438/391
(58) Field of Search ................. 257/304, 311, 257/510, 296; 438/387, 391

(56) References Cited

U.S. PATENT DOCUMENTS

| | | | |
|---|---|---|---|
| 4,873,560 A | * 10/1989 | Sunami et al. .............. 357/23.6 |
| 4,916,524 A | * 4/1990 | Teng et al. ................. 357/23.6 |
| 4,942,554 A | * 7/1990 | Kircher et al. .............. 365/149 |
| 4,988,637 A | * 1/1991 | Dhong et al. ................. 437/52 |
| 5,185,294 A | * 2/1993 | Lam et al. ................... 437/193 |
| 5,225,697 A | * 7/1993 | Mal hi et al. ............... 257/302 |
| 5,262,346 A | * 11/1993 | Bindal et al. ................. 437/62 |
| 5,363,327 A | * 11/1994 | Henkles et al. .............. 365/149 |
| 5,369,049 A | * 11/1994 | Acocella et al. ............... 437/52 |
| 5,395,786 A | * 3/1995 | Hsu et al. ...................... 437/52 |
| 5,422,294 A | * 6/1995 | Noble, Jr. ...................... 437/52 |
| 5,504,357 A | * 4/1996 | Kim et al. ................... 257/306 |
| 5,770,876 A | * 6/1998 | Lam et al. ................... 257/301 |
| 5,895,255 A | * 4/1999 | Tsuchiaki .................... 438/427 |
| 5,981,332 A | * 11/1999 | Mandelman et al. ....... 438/246 |
| 6,004,844 A | * 12/1999 | Alsmeier et al. ........... 438/246 |
| 6,025,230 A | * 2/2000 | Hshieh et al. .............. 438/268 |
| 6,066,527 A | * 5/2000 | Kudelka et al. ............ 438/243 |
| 6,080,618 A | * 6/2000 | Bergner et al. ............. 438/243 |

FOREIGN PATENT DOCUMENTS

EP 738006 A2 * 10/1996

* cited by examiner

Primary Examiner—Eddie Lee
Assistant Examiner—Eugene Lee

(57) ABSTRACT

A method for controlling isolation layer thickness in deep trenches for semiconductor memories in accordance with the present invention includes the steps of providing a deep trench having a storage node formed therein, the storage node having a buried strap, depositing an isolation layer on the buried strap for providing electrical isolation for the storage node, forming a masking layer on the isolation layer to mask a portion of the isolation layer in contact with the buried strap and removing the isolation layer except the portion masked by the mask layer such that control of a thickness of the isolation layer is improved. A method for fabricating vertical transistors by recessing a substrate to permit increased overlap between a transistor channel and buried strap outdiffusion when the transistor is formed is also included. A semiconductor device is also disclosed.

8 Claims, 11 Drawing Sheets

APPARATUS AND METHOD FOR FORMING CONTROLLED DEEP TRENCH TOP ISOLATION LAYERS

This is a divisional, of application Ser. No. 09/127,262 filed on Jul. 31, 1998.

BACKGROUND

1. Technical Field

This disclosure relates to semiconductor devices and more particularly, to an apparatus and method for forming deep trench isolation layers for semiconductor memories.

2. Description of the Related Art

Semiconductor memories such as dynamic random access memories (DRAM) typically include memory cells. These memory cells include storage nodes. Generally these storage nodes are formed within deep trenches etched into substrates of the semiconductor memory chip. The storage nodes are accessed using an access transistor which allows charge to be stored in the storage node or retrieves charge from the storage depending on whether the desired action is a read or write function. It is often necessary to ensure that the storage node is sufficiently electrically isolated from a gate conductor.

One way to ensure sufficient electrical isolation of the storage node is to provide a top trench oxide layer over the storage node. The storage nodes typically include polysilicon material that partially fills the deep trench. During fabrication the polysilicon leaves a recess remaining at the top of the trench. An oxide (silicon dioxide) is deposited over the surface of the semiconductor device. During the oxide deposition, oxide is formed over the polysilicon in the trench. Other portions of the deposited oxide are removed by planarizing the surface of the semiconductor device and by recessing the oxide to leave a 30–50 nm oxide layer at the bottom of the recess. This oxide layer is referred to as a trench top oxide or isolation.

The oxide recessing is difficult to control. This difficulty introduces a lot of variability in the remaining oxide layer thickness. The trench top oxide thickness is an important parameter and must be maintained in order for the semiconductor memory to work properly. As described above, the trench top oxide electrically isolates the storage node from the gate conductor of the semiconductor device.

Therefore, a need exists for a trench top dielectric having a controlled thickness. A further need exists for a method of providing the trench top isolation for transistors formed on top of deep trenches.

SUMMARY OF THE INVENTION

A method for controlling isolation layer thickness in deep trenches for semiconductor memories in accordance with the present invention includes the steps of providing a deep trench having a storage node formed therein, the storage node having a buried strap, depositing an isolation layer on the buried strap for providing electrical isolation for the storage node, forming a masking layer on the isolation layer to mask a portion of the isolation layer in contact with the buried strap and removing the isolation layer except the portion masked by the mask layer such that control of a thickness of the isolation layer is improved.

In other useful methods in accordance with the present invention, the step of depositing the isolation layer may include depositing the isolation layer by chemical vapor deposition or by plasma enhanced chemical vapor deposition. The isolation layer may include an oxide, a nitride or a combination of both. The thickness of the isolation layer is preferably between about 20 nm to about 50 nm. The step of forming the masking layer may include the step of depositing a material which is selectively etchable relative to the isolation layer. The material may include polysilicon.

A method for fabricating a memory cell having trench isolation includes the steps of providing a deep trench having a storage node formed therein, the storage node having a buried strap, depositing an isolation layer on the buried strap for providing electrical isolation for the storage node, forming a masking layer on the isolation layer to mask a portion of the isolation layer in contact with the buried strap, selectively etching the isolation layer relative to the masking layer to leave the portion masked by the masking layer, opening up an isolation trench in communication with the deep trench by removing at least a portion of the substrate adjacent to the deep trench, filling the isolation trench with a dielectric material to provide trench isolation.

In other particularly useful methods, the step of forming an access device for accessing the storage node disposed within the trench below the isolation layer is preferably included. The step of forming an access device may include forming a transistor having a channel formed in the substrate for electrically coupling the buried strap to a bitline. The step of recessing the portion of the substrate adjacent to the deep trench such that the transistor is formed a greater distance away from the deep trench is preferably included. The step of forming a transistor gate adjacent to the trench isolation and adjacent to the isolation layer in a top portion of the deep trench may also be included. The isolation layer may be deposited by chemical vapor deposition. The isolation layer may include an oxide a nitride or a combination of both. The thickness of the isolation layer is preferably between about 20 nm to about 50 nm. The masking layer may include polysilicon. The trench isolation may include shallow trench isolation or raised shallow trench isolation.

A method for fabricating a vertical transistor includes the steps of providing a substrate having trenches formed therein, each trench having a storage node formed therein, the storage node having a buried strap, forming an isolation layer on the buried strap, laterally etching the substrate to recess a step into the substrate such that the recess extends beyond sides of the trench, the recess being in communication with the trench and forming a gate conductor in the recess such that a channel is formed adjacent to the gate conductor for providing electrical conduction between the buried strap and a conductive line upon activation of the gate conductor.

In other methods of fabricating a vertical transistor, the step of laterally etching preferably includes laterally etching by a dry etch process, such as a chemical downstream etch or a reactive ion etch process. The conductive line may include a bitline.

A semiconductor memory includes a substrate having a plurality of deep trenches formed therein. Each deep trench has a buried strap formed therein for accessing a storage node disposed within the deep trench, a deposited isolation layer formed on the buried strap for providing electrical isolation for the buried strap and a masking layer formed on the isolation layer for providing a mask for a portion of the isolation layer in contact with the buried strap, the masking layer being selectively etchable relative to the isolation layer wherein the masking layer provides improved control of a thickness of the isolation layer.

In alternate embodiments of the semiconductor memory, the masking layer may include polysilicon. The isolation layer may include an oxide, a nitride or a combination of both. The thickness of the isolation layer is preferably between about 20 nm to about 50 nm. An access transistor may be included having a gate formed in the trench and having at least a portion of the gate in contact with the isolation layer, the transistor having a channel formed in the substrate adjacent to the gate for electrically coupling the buried strap to a bitline. The trench isolation may be formed in at least a portion of the trench for isolating the gate from the storage node. The substrate may include a recessed portion, the recessed portion for enabling the gate and channel to be located further away from the trench.

A method for fabricating a vertical transistor for semiconductor memories with deep trenches includes the steps of providing a substrate having deep trenches formed therein, each deep trench having a storage node formed therein, the storage node having a buried strap recessed below a top surface of the substrate, forming an isolation layer on the buried strap and on trench sidewalls, depositing a dummy layer on the isolation layer, opening up an isolation trench in communication with the deep trench by removing at least a portion of the substrate adjacent to the deep trench, filling the isolation trench with a dielectric material to provide trench isolation, selectively etching the dummy layer relative to the dielectric material and the isolation layer, removing the isolation layer from the trench sidewalls and forming a vertical transistor adjacent to the portion of the substrate that was removed.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

This disclosure relates to semiconductor devices and more particularly, to an apparatus and method for forming deep trench isolation layers for semiconductor memories. The present invention provides an improved method for forming a top trench isolation layer over a storage node in a deep trench. A dummy or masking layer is introduced after deposition of the trench top isolation layer. In this way, the dummy layer may be etched to a desired height. The dummy layer is then planarized and recessed in portions leaving a controlled trench top isolation layer portion over the storage node. Further details are included herein.

Figure 1:
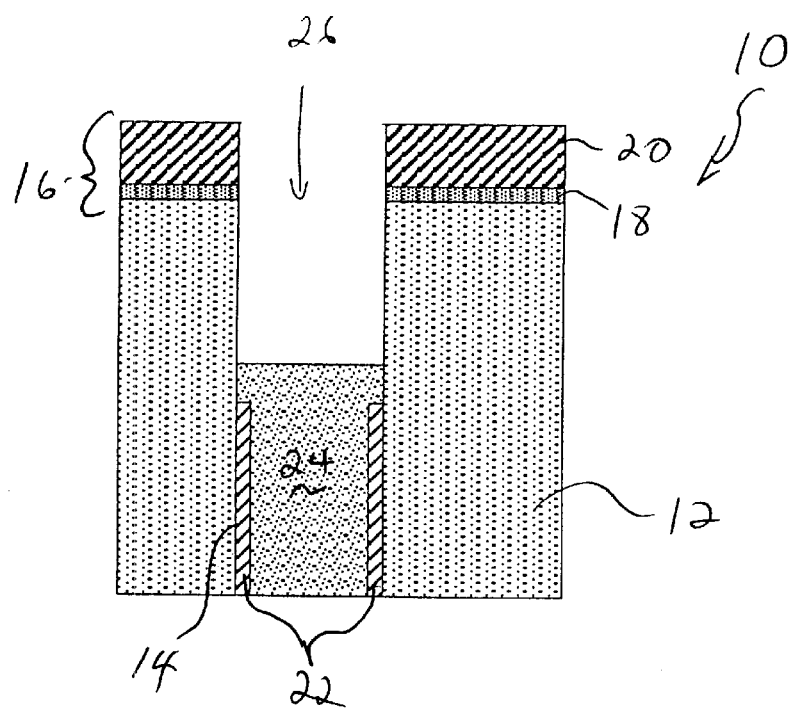
FIG. 1 is a cross-sectional view of a portion of a semiconductor device showing a trench structure.

Referring now in specific detail to the drawings in which like reference numerals identify similar or identical elements throughout the several views, FIG. 1 shows a portion of a semiconductor device 10. Semiconductor device 10 includes a substrate 12 preferably a silicon substrate although other materials are contemplated, for example gallium arsenide. A deep trench 14 is formed in substrate 12 through a pad stack 16 which preferably includes a pad oxide layer 18 and a pad nitride layer 20 by processes known to those skilled in the art. Pad oxide layer 18 is preferably formed by thermal oxidation although a deposition process may be used. Pad nitride layer 20 is preferably deposited on pad oxide layer 18. A collar 22 is formed in trench 14 for electrically isolating a portion of trench 14 from substrate 12. A lower portion of trench 14 (not shown) is further electrically isolated from substrate 12 by a thin dielectric layer (not shown) about the sides and bottom of trench 14.

Trench 14 is filled with a conductive filler material 24, preferably polysilicon or doped polysilicon. Filler material 24 extends over a top portion of collar 22 and contacts substrate 12. A recess 26 is thereby left in trench 14.

Figure 2:
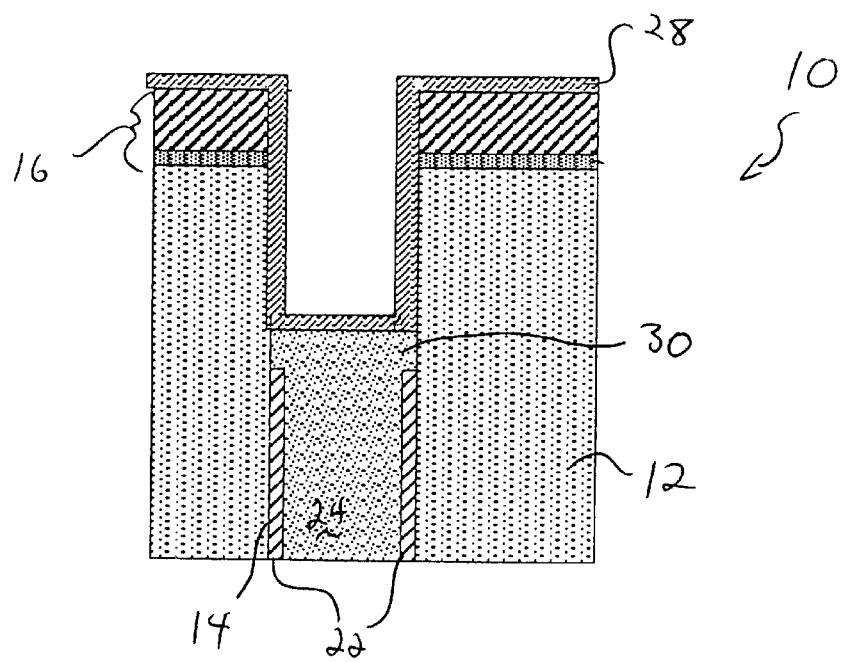
FIG. 2 is a cross-sectional view of the semiconductor device of FIG. 1 having an isolation layer deposited thereon in accordance with the present invention.

Referring to FIG. 2, an isolation layer 28 is deposited. Isolation layer 28 coats exposed surfaces including pad stack 16, walls of trench 14 and filler material 24. Isolation layer 28 includes a dielectric material for isolating filler material 24 which functions as a storage node in operation. Filler material 24 between isolation layer 28 and the top of collar 22 is typically called a buried strap 30. Isolation layer 28 preferably includes an oxide, for example silicon oxide, a nitride, for example a silicon nitride, or a combination thereof. The deposition of isolation layer 28 results in better control of a thickness of layer 28 by eliminating conventional filling and recessing as performed in the prior art. Deposition of isolation layer 28 may include chemical vapor deposition (CVD), plasma enhanced chemical vapor deposition (PECVD) or other suitable deposition processes. Such deposition processes are preferred since isolation layer thicknesses are better and more reliably controlled than in the prior art. In a preferred embodiment, layer 28 has a thickness between about 20 nm to about 50 nm, and more preferably between about 30 nm to about 40 nm.

Figure 3:
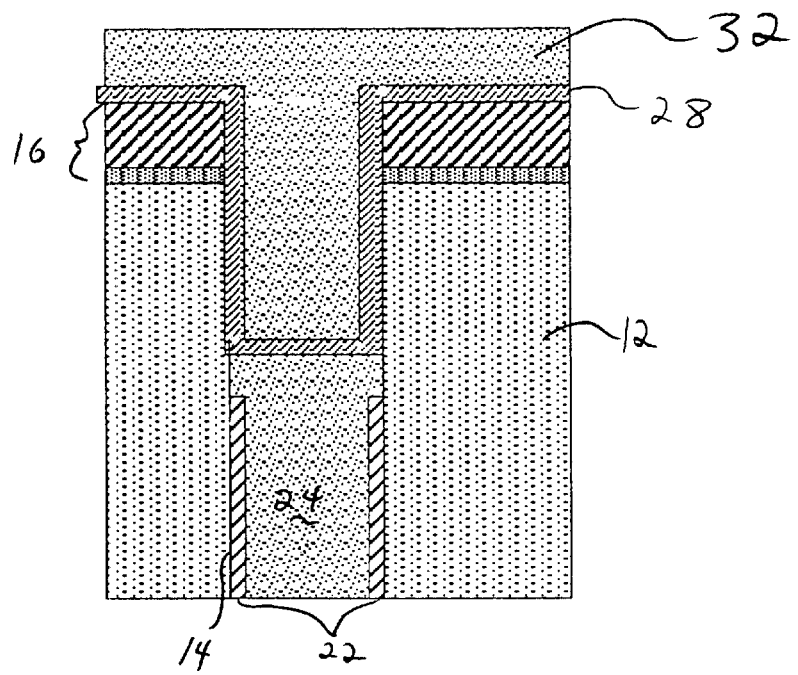
FIG. 3 is cross-sectional view of the semiconductor device of FIG. 2 having a masking layer deposited thereon in accordance with the present invention.
Figure 4:
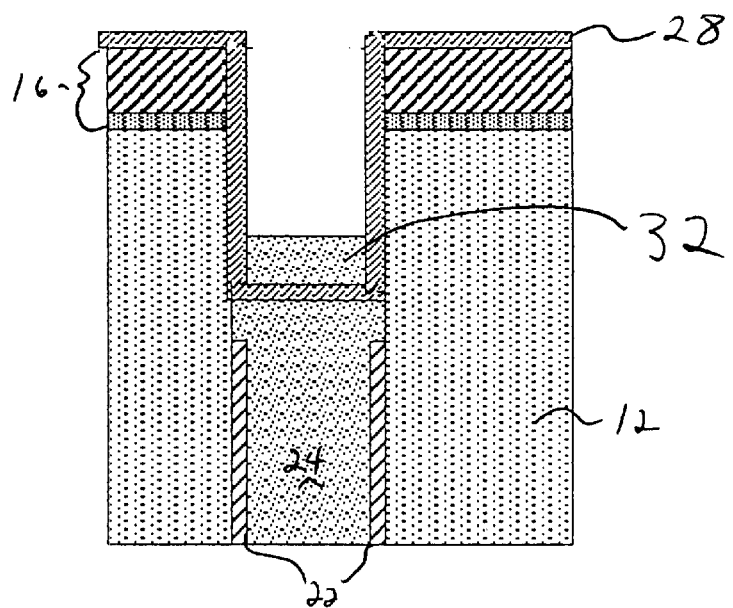
FIG. 4 is cross-sectional view of the semiconductor device of FIG. 3 after the masking layer is etched back in accordance with the present invention.
Figure 5:
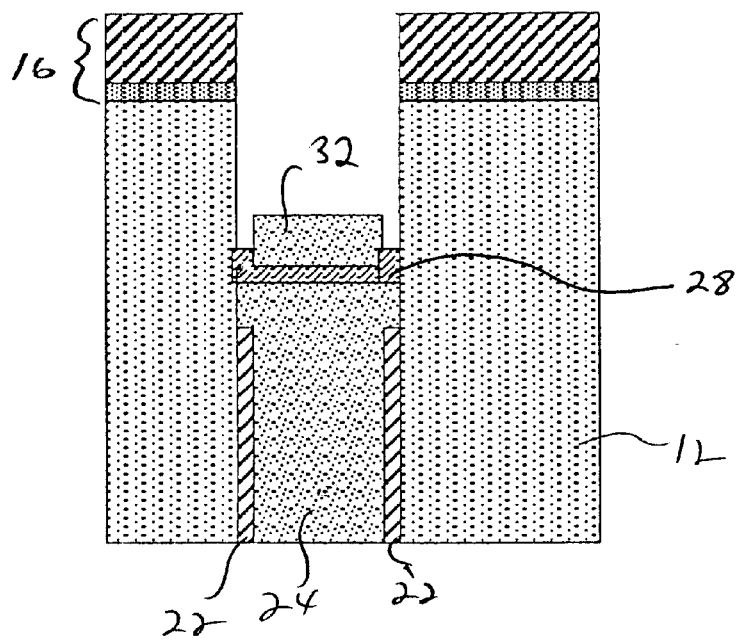
FIG. 5 is cross-sectional view of the semiconductor device of FIG. 4 having the isolation layer etched leaving a portion of the isolation layer below the masking layer in accordance with the present invention.

Referring to FIGS. 3–10, the formation of a controlled isolation layer for raised shallow trench isolation (RSTI) is described. Referring to FIG. 3, a dummy or masking layer 32 is deposited on the structure shown in FIG. 2. Dummy layer 32 is preferably polysilicon which advantageously is easier to recess than oxides or nitrides. Dummy layer 32 may also include a resist. As shown in FIG. 4, dummy layer 32 is recessed down into trench 14 to a predetermined height above isolation layer 28. Isolation layer 28 is selectively etched, preferably by a wet etching process, although dry etching is also contemplated, to remove portions of isolation layer 28 other than the portion masked by dummy layer 32, as shown in FIG. 5. Wet etching may include etching with HF or HF glycerol. Dry etching may include chemical downstream etching or reactive ion etching.

Figure 6:
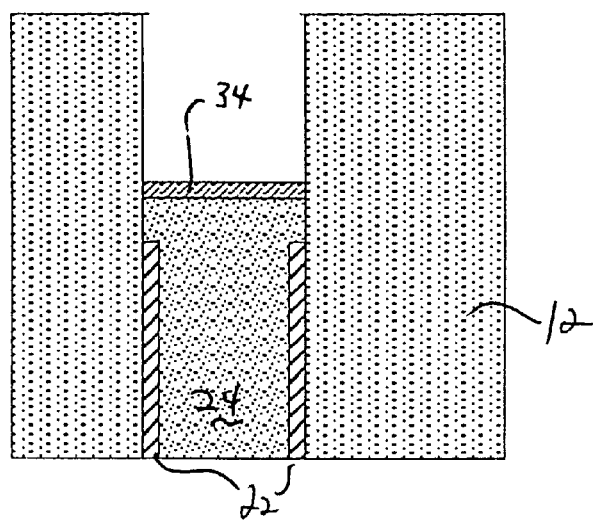
FIG. 6 is cross-sectional view of the semiconductor device of FIG. 5 showing the masking layer removed in accordance with the present invention.

Referring to FIG. 6, pad stack 16 is stripped from substrate 12, preferably by a wet etching process. Dummy mask 32 is optionally etched away, however, depending on the design, dummy mask 32 may be left. The remaining structure includes a controlled trench top isolation layer 34 and is now ready for a sacrificial oxide deposition and ion implantation to form devices on device 10.

Figure 7:
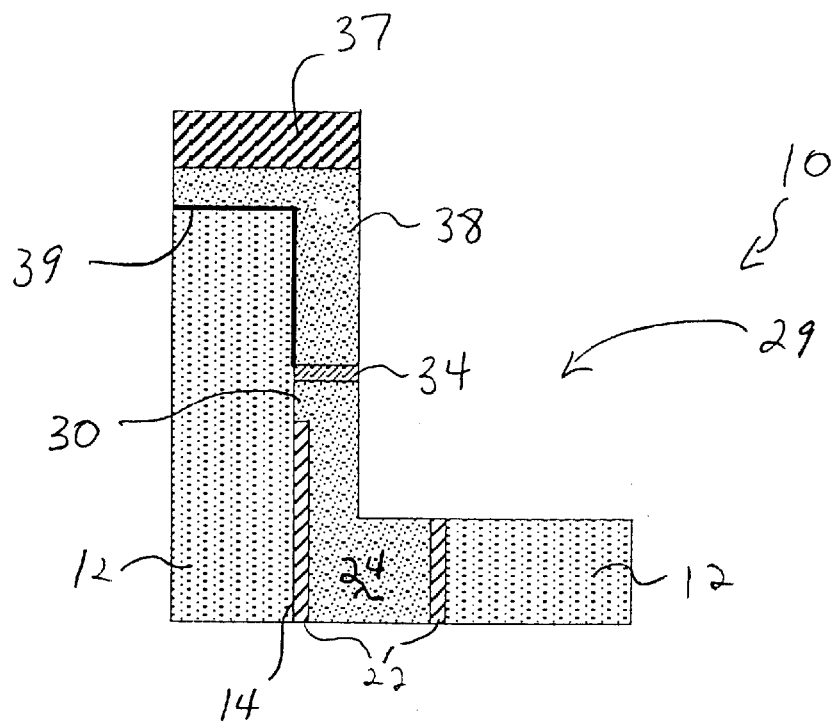
FIG. 7 is cross-sectional view of the semiconductor device of FIG. 6 after an isolation trench is etched away in accordance with the present invention.

Referring to FIG. 7, after ion implantation, the sacrificial oxide layer (not shown) is removed. A conductive material 38 is deposited in trench 14. After removing the sacrificial oxide layer, a gate oxide 39 is formed, followed by a conductive material 38 deposition (part of gate conductor 36). Conductive material 38 deposition can fill or underfill the trench recess. A second pad layer 37, preferably nitride is deposited. Device 10 is masked (active area) and portions of device 10 are etched to form an isolation trench 29 for raised shallow trench isolation materials. A portion of substrate 12, buried strap 30, trench top isolation layer 34, collar 22, filler material 24 and conductive material 38 are removed as shown in FIG. 7.

Figure 8:
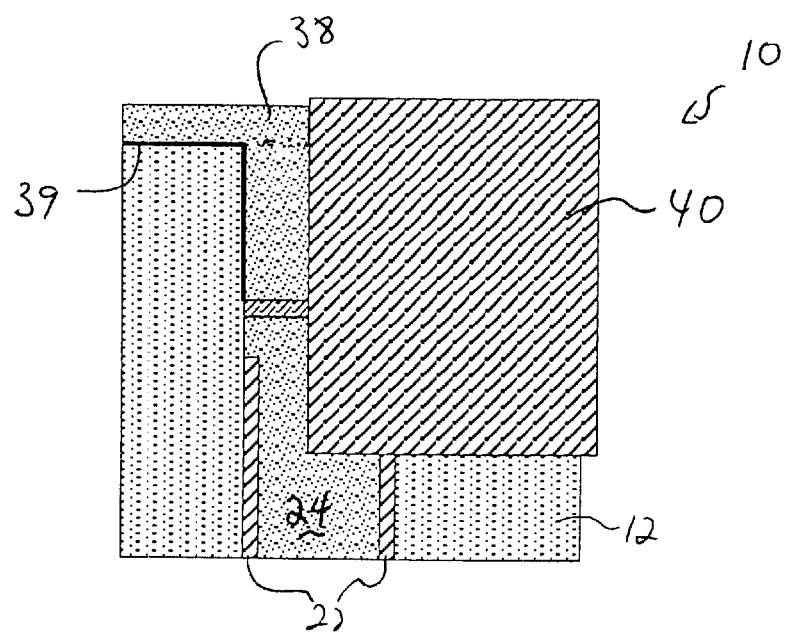
FIG. 8 is cross-sectional view of the semiconductor device of FIG. 7 showing raised shallow trench isolation dielectric formed in the position in accordance with the present invention.
Figure 9:
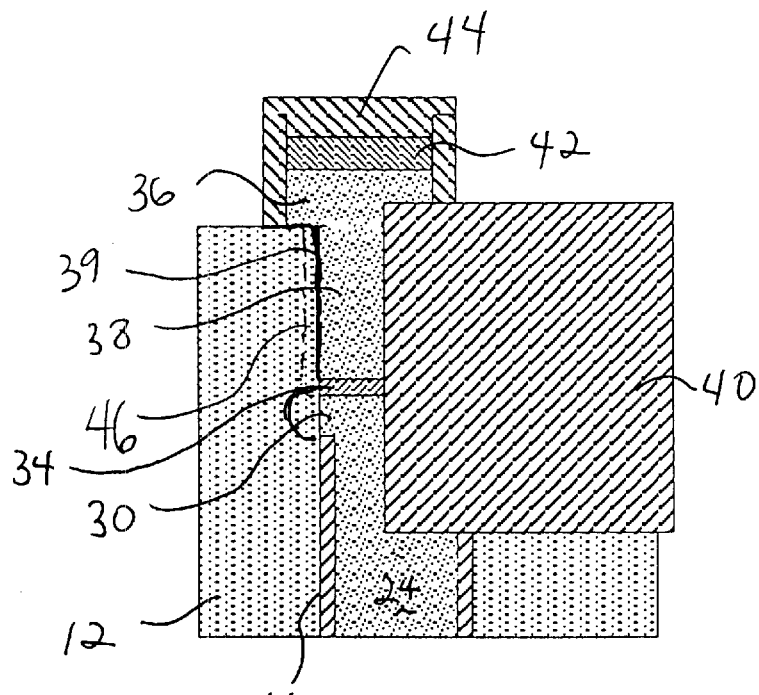
FIG. 9 is cross-sectional view of the semiconductor device of FIG. 8 showing a gate stack formed in the trench in accordance with the present invention.

Referring to FIGS. 8 and 9, a dielectric material 40, preferably an oxide, is deposited in isolation trenches 29 and planarized to pad layer 37. Pad layer 37 is stripped, followed by the deposition of remaining gate stack layer. A gate conductor 36 is formed by depositing additional conductive material, preferably includes polysilicon or doped polysilicon. A conductive layer 42, for example a silicide, such as tungsten silicide, may be deposited on gate conductor 36, to further improve conduction of gate conductor 36. Gate conductor 36 and conductive layer 42 are isolated by a dielectric material 44 on the top and the sides to form a gate stack. Dielectric material 44 may include an oxide or a nitride, preferably silicon nitride. Gate conductor 36 is adjacent to a portion 46 of substrate 12. Portion 46 functions as a channel for a vertical transistor. The vertical transistor has a bitline 210 as a source and a storage node 204 as a drain (See FIG. 19). As shown in FIG. 9, gate conductor 36 is separated from buried strap 30 by isolation layer 34. As described, isolation layer 34 is reliably formed to a predetermined thickness by a deposition process which uses a dummy layer 32 for its formation. Although shown for a vertical transistor configuration the method described is easily extended to other transistors and devices. A thin gate oxide layer 39 is disposed between the gate conductor and substrate 12 as is known in the art.

Figure 10:
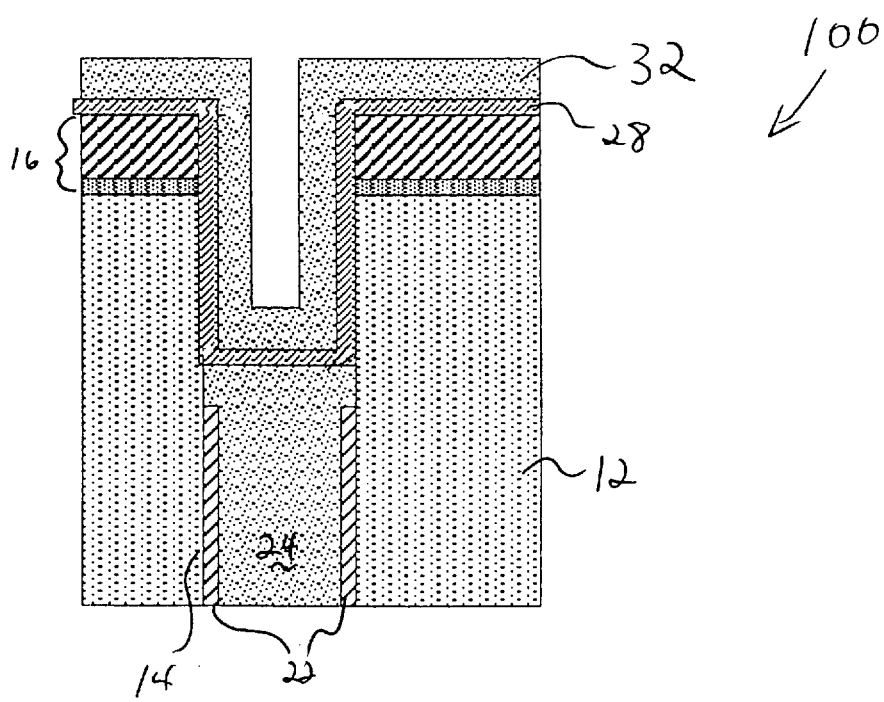
FIG. 10 is cross-sectional view of another embodiment, the semiconductor device of FIG. 2 is shown having a masking layer deposited thereon in accordance with the present invention.

Referring to FIGS. 10–17, a method in accordance with the present invention will now be described for shallow trench isolation (STI). Referring to FIG. 10, a dummy or masking layer 32 is deposited on the structure of FIG. 2. Dummy layer 32 covers isolation layer 28. Isolation layer 28 is substantially the same as described above. Dummy layer 32 preferably includes polysilicon. Dummy layer 32 may be deposited having a thickness of between about 20 nm to about 50 nm. Dummy layer 32 may also be used as an anti-reflection coating (ARC) for subsequent lithographic processes for forming active areas for devices to be formed in later steps.

Figure 11:
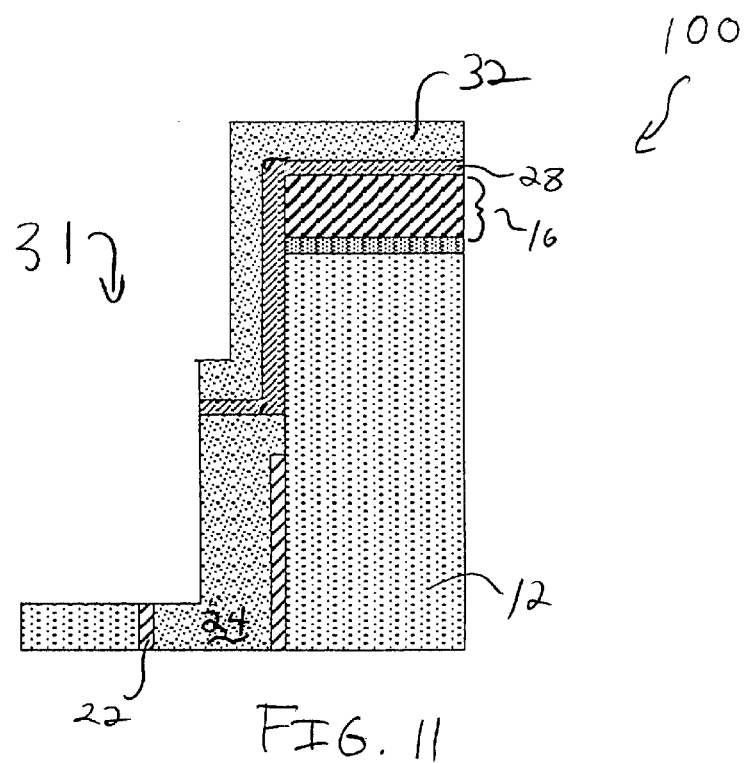
FIG. 11 is cross-sectional view of the semiconductor device of FIG. 10 after a position or hole is etched away in accordance with the present invention.
Figure 12:
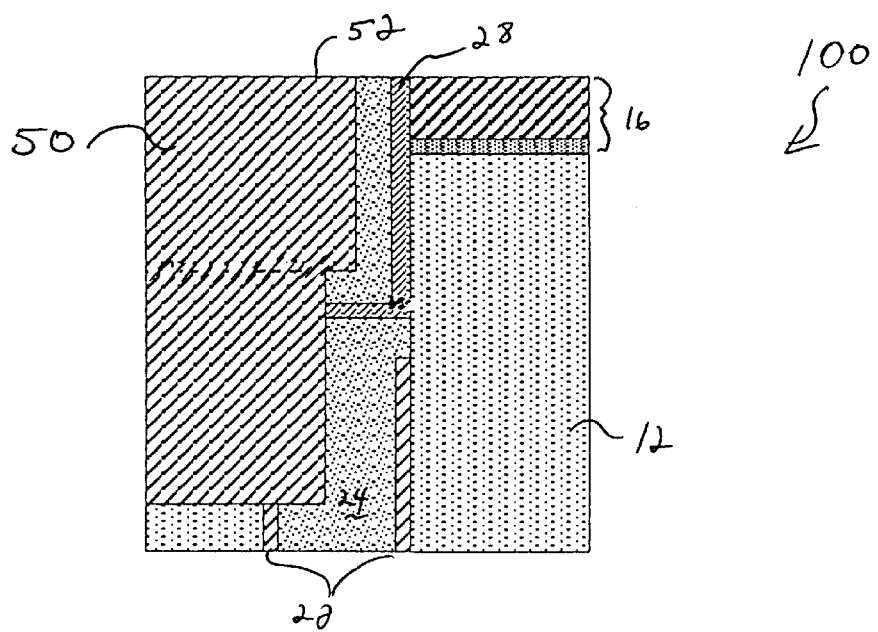
FIG. 12 is cross-sectional view of the semiconductor device of FIG. 11 showing shallow trench isolation dielectric formed in the position in accordance with the present invention.

Referring to FIGS. 11 and 12, device 100 is masked and portions of device 100 are etched to form a position 31 for shallow trench isolation materials. A portion of substrate 12, buried strap 30, trench top isolation layer 28, collar 22, filler material 24 and dummy layer 32 are removed as shown in FIG. 11. As shown in FIG. 12, position 31 is filled with a dielectric material 50, preferably an oxide, such as silicon dioxide. A top surface 52 is planarized to prepare surface 52 for further processing.

Figure 13:
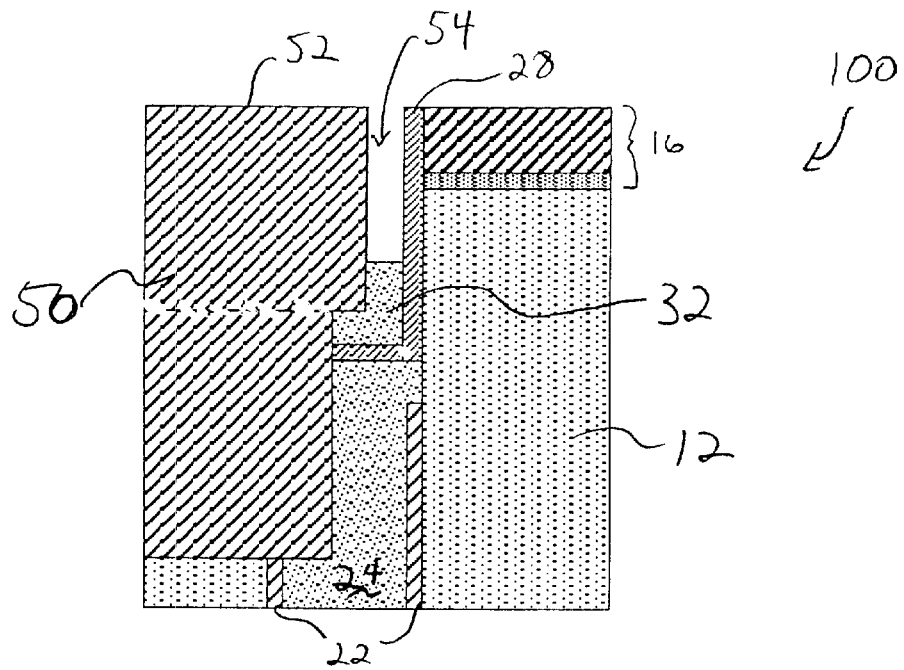
FIG. 13 is cross-sectional view of the semiconductor device of FIG. 12 showing a portion of the shallow trench isolation dielectric removed with a portion of the masking layer in accordance with the present invention.
Figure 14:
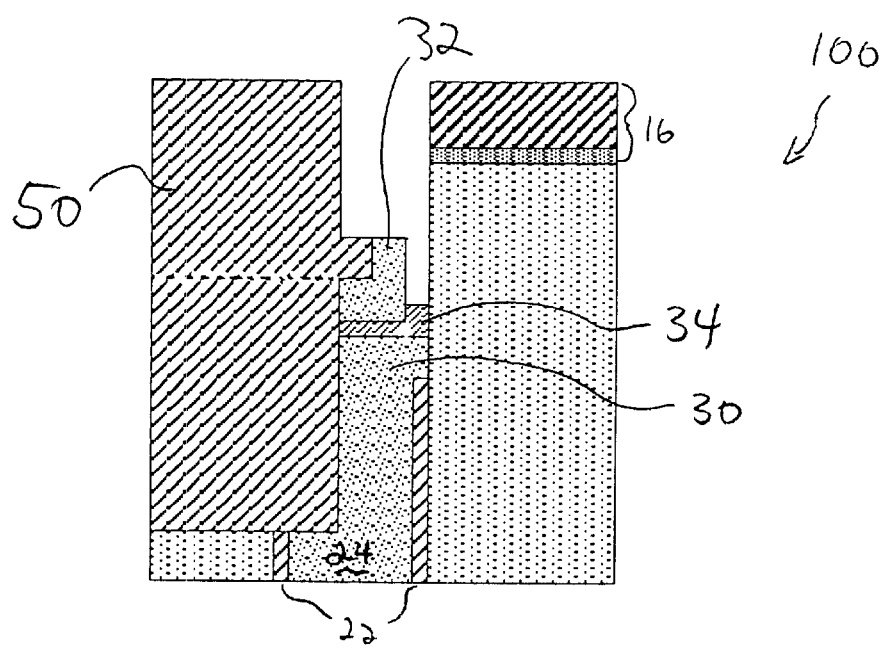
FIG. 14 is cross-sectional view of the semiconductor device of FIG. 13 having the isolation layer etched leaving a portion of the isolation layer below the masking layer in accordance with the present invention.

Referring to FIGS. 13 and 14, top surface 52 may be deglazed to remove any remaining oxides therefrom. Dummy layer 32 is recessed to form recess 54 as shown. As shown in FIG. 14, isolation layer 28 is selectively etched relative to dummy layer 32. A portion of dielectric material 50 may be etched as well. The etching process, preferably includes wet etching, although dry etching is also contemplated. Wet etching may include etching with HF or HF glycerol. Dry etching may include chemical downstream etching or reactive ion etching. Dummy layer 32 masks a part of isolation layer 28 in contact with buried strap 30 such that a controlled isolation layer 34 is formed.

Figure 15:
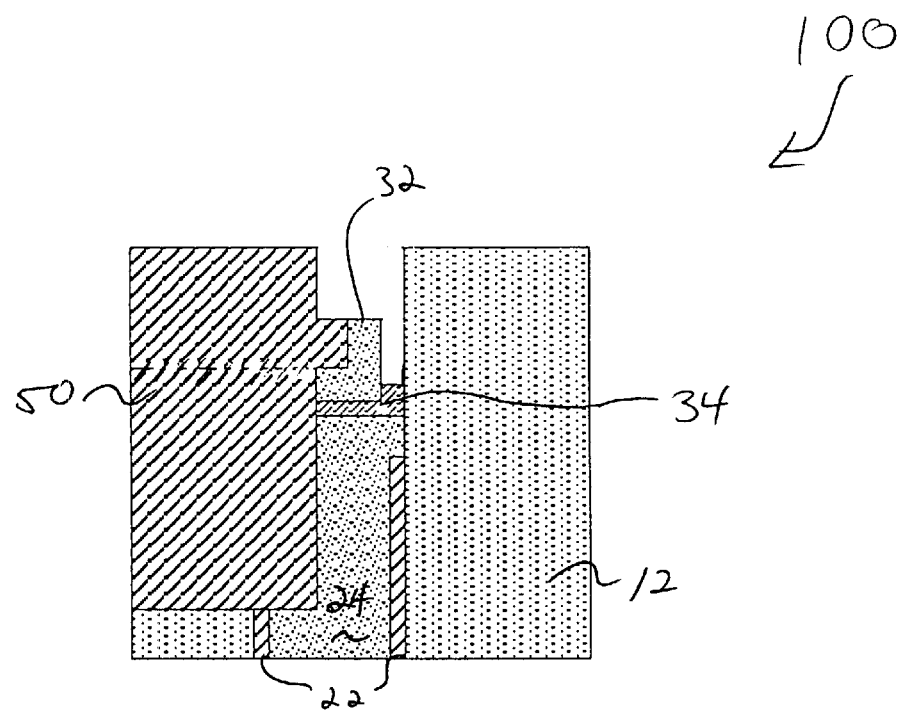
FIG. 15 is cross-sectional view of the semiconductor device of FIG. 14 having a pad stack removed in accordance with the present invention.

Referring to FIG. 15, pad stack 16 is stripped from substrate 12, preferably by a wet etching process. Dummy layer 32 is optionally etched away prior to the pad oxide strip, however, depending on the design, dummy layer 32 may be left. The remaining structure includes controlled trench top isolation layer 34 and is now ready for a sacrificial oxide deposition and ion implantation to form devices on device 100.

Figure 16:
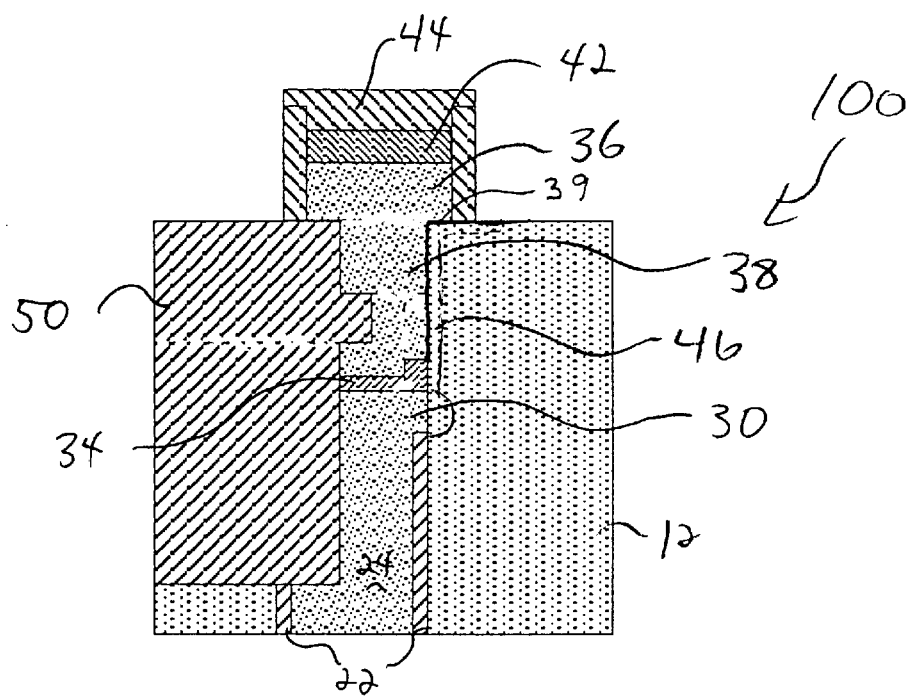
FIG. 16 is cross-sectional view of the semiconductor device of FIG. 15 showing a gate stack formed in the trench in accordance with the present invention.

Referring to FIG. 16, after ion implantation, the sacrificial oxide layer (not shown) is removed. A gate conductor 36 is formed by building a gate stack on top of a conductive material 38. Conductive material 38 preferably includes polysilicon or doped polysilicon. A thin gate oxide layer 39 is disposed between the gate conductor and substrate 12 as is known in the art. A conductive layer 42, for example a silicide, such as tungsten silicide, may be deposited on gate conductor 36, to further improve conduction of gate conductor 36. Gate conductor 36 and conductive layer 42 are isolated by a dielectric material 44 on the top and the sides. Dielectric material 44 may include an oxide or a nitride, preferably silicon nitride. Gate conductor 36 is adjacent to a portion 46 of substrate 12. Portion 46 functions as a channel for a vertical transistor. The vertical transistor has a bitline 210 as a source and a storage node 204 as a drain (See FIG. 19). As shown in FIG. 16, gate conductor 36 is separated from buried strap 30 by isolation layer 34. As described, isolation layer 34 is reliably formed to a predetermined thickness by a deposition process which uses a dummy layer 32 for its formation. Although shown for a vertical transistor configuration the method described is easily extended to other transistors and devices.

Figure 17:
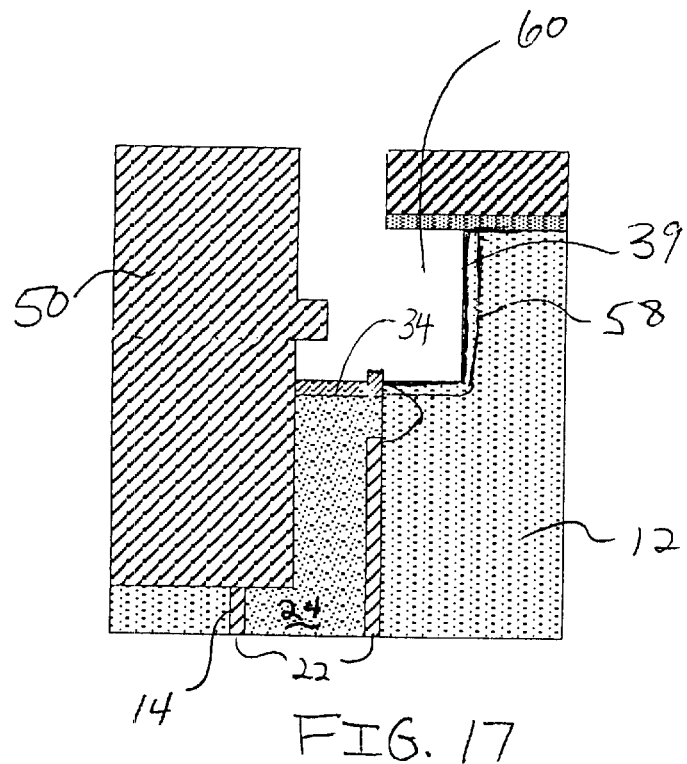
FIG. 17 is cross-sectional view of another embodiment of the present invention showing a recessed substrate for providing a transistor device that is further away from a trench in accordance with the present invention.
Figure 18:
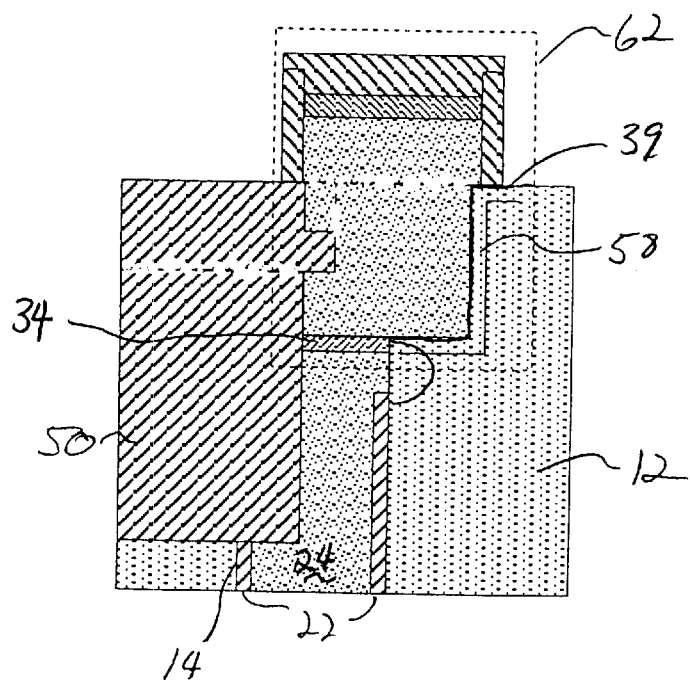
FIG. 18 is cross-sectional view of another embodiment of the present invention showing the recessed substrate having a transistor gate and a transistor channel that are further away from a trench in accordance with the present invention.

Referring to FIGS. 17 and 18, in one embodiment, the structure of FIG. 14 may be further processed to achieve improvements for vertical transistors. It is advantageous to move a transistor channel 58 further away from trench 14 to enhance overlap with buried strap outdiffusion without impacting device performance by formation of deep junctions. An etching process is preferably performed to remove a portion 60 of substrate 12 such that when channel 58 is formed, channel 58 is further away from trench 14. At the same time, dummy layer 32 may also be etched. The etching process preferably includes dry etching, for example chemical downstream etching. Substrate 12 is etched such that a recess 60 is formed. As shown in FIG. 18, recess 60 provides room for a vertical transistor 62 (bounded by dashed lines) to be moved further away from trench 14. A thin gate oxide layer 39 is disposed between the gate conductor and substrate 12 as is known in the art.

Figure 19:
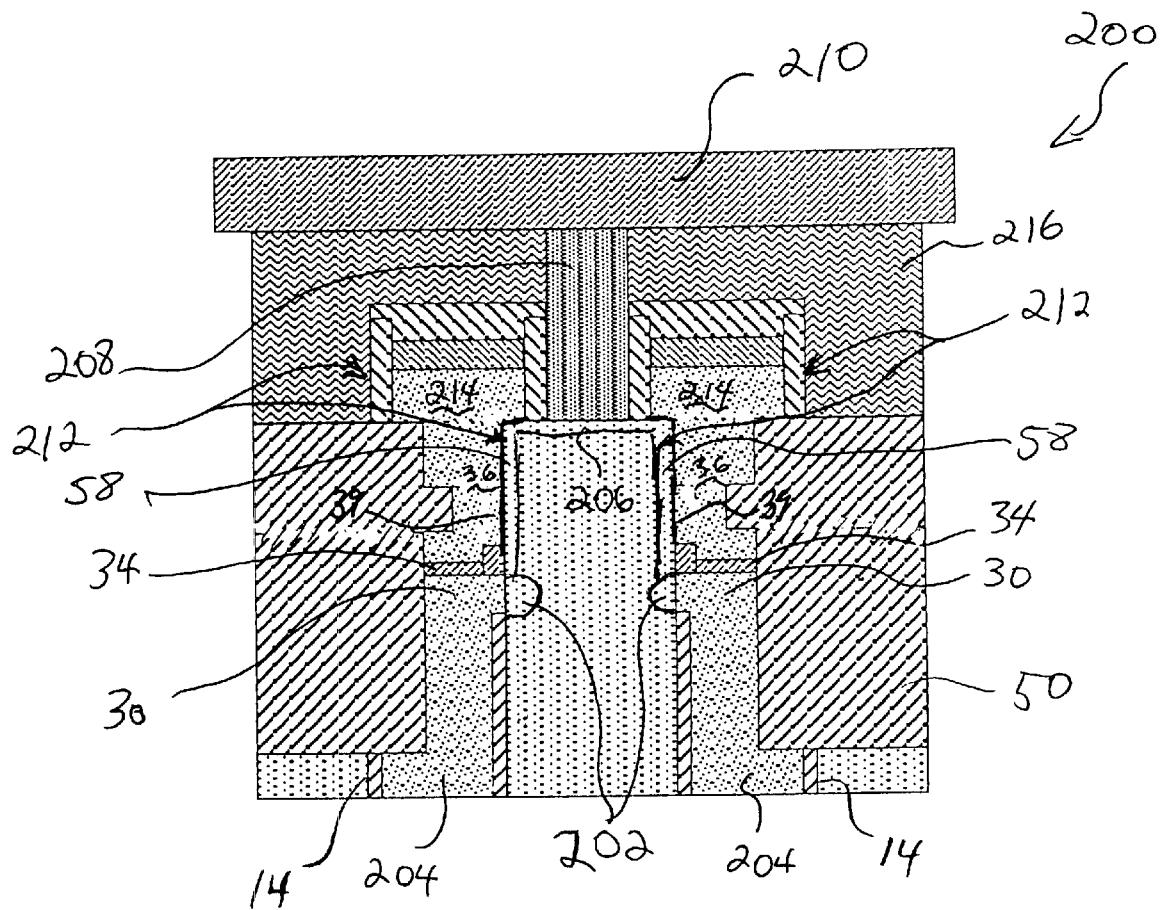
FIG. 19 is cross-sectional view of a semiconductor device showing two vertical transistors in accordance with the present invention.
Figure 20:
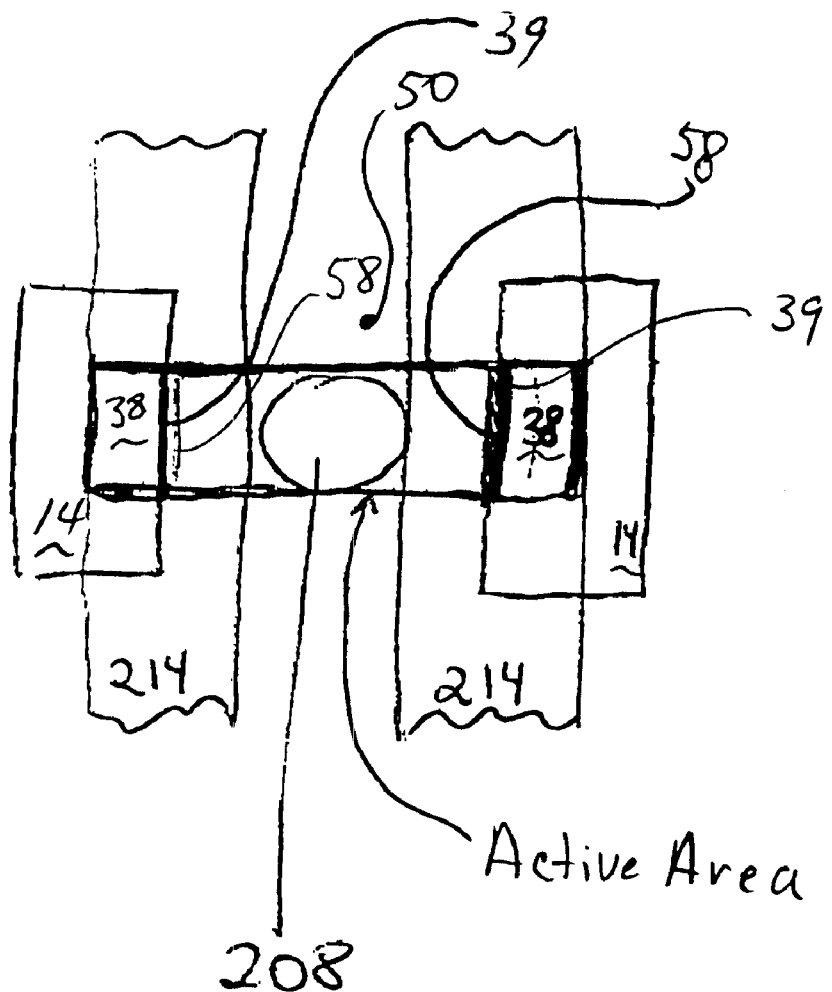
FIG. 20 is a schematic view showing the topology of the semiconductor device of FIG. 19.

Referring to FIGS. 19 and 20, a semiconductor memory 200 is shown having two memory cells in accordance with the present invention. Each memory cell includes buried strap 30 having isolation layer 34 formed thereon in accordance with the methods of the present invention. Buried strap 30 includes an outdiffusion region 202 which assists in connecting channels 58 to a storage node 204 within trench 14. A doped region 206 joins channels 58 to a bitline contact 208 which connects to a bitline 210. Bitline 210 acts as a source for vertical transistor 212 while storage node 204 acts as a drain. During operation, a gate 214 is activated allowing current to flow between bitline 210 and storage node 204. Isolation layer 34 separates gate conductor 36 from storage node 204. A thin gate oxide layer 39 is disposed between the gate conductor and substrate 12 as is known in the art. A dielectric layer 216 isolates bitline 210. Dielectric layer 216 preferably includes an oxide, such as borophosphosilicate glass (BPSG).

Having described preferred embodiments for an apparatus and method for forming deep trench isolation layers for semiconductor memories (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor memory comprising:

a substrate having a plurality of deep trenches formed therein, each deep trench having:

a buried strap formed therein for accessing a storage node disposed within the deep trench;

a deposited isolation layer formed on the buried strap for providing electrical isolation for the buried strap; and a masking layer formed on the isolation layer for providing a mask for a portion of the isolation layer in contact with the buried strap, the masking layer being selectively etchable relative to the isolation layer wherein the masking layer provides improved control of a thickness of the isolation layer.

2. The semiconductor memory as recited in claim 1, wherein the masking layer includes polysilicon.

3. The semiconductor memory as recited in claim 1, wherein the isolation layer includes an oxide.

4. The semiconductor memory as recited in claim 1, wherein the isolation layer includes a nitride.

5. The semiconductor memory as recited in claim 1, wherein the thickness of the isolation layer is between about 20 nm to about 50 nm.

6. The semiconductor memory as recited in claim 1, further comprising an access transistor including a gate formed in the trench and having at least a portion of the gate in contact with the isolation layer, the transistor having a channel formed in the substrate adjacent to the gate for electrically coupling the buried strap to a bitline.

7. The semiconductor memory as recited in claim 6, further comprising trench isolation formed in at least a portion of the deep trench for isolating the gate from the storage node.

8. The semiconductor memory as recited in claim 6, wherein the substrate includes a recessed portion, the recessed portion for enabling increased overlap between outdiffusion from the buried strap and the channel.

* * * * *